US012802759B2

(12) United States Patent
Choi

(10) Patent No.: US 12,802,759 B2
(45) Date of Patent: Nov. 17, 2026

(54) MEMORY DEVICE AND METHOD OF OPERATING THE MEMORY DEVICE TO REDUCE PROGRAM DISTURB EFFECTS

(71) Applicant: SK hynix Inc., Icheon-si (KR)

(72) Inventor: Young Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 463 days.

(21) Appl. No.: 18/321,617

(22) Filed: May 22, 2023

(65) Prior Publication Data

US 2024/0185921 A1 Jun. 6, 2024

(30) Foreign Application Priority Data

Dec. 2, 2022 (KR) ........................ 10-2022-0167052

(51) Int. Cl.

| | |
|---|---|
| ***G11C 16/08*** | (2006.01) |
| ***G11C 5/06*** | (2006.01) |
| ***G11C 11/56*** | (2006.01) |
| ***G11C 13/00*** | (2006.01) |
| ***G11C 16/04*** | (2006.01) |
| ***G11C 16/10*** | (2006.01) |
| ***G11C 16/12*** | (2006.01) |
| ***G11C 16/34*** | (2006.01) |

(52) U.S. Cl.

CPC .............. *G11C 16/08* (2013.01); *G11C 5/063* (2013.01); *G11C 11/5628* (2013.01); *G11C 13/0028* (2013.01); *G11C 13/0069* (2013.01); *G11C 16/10* (2013.01); *G11C 16/12* (2013.01); *G11C 16/3459* (2013.01); *G11C 16/0483* (2013.01)

(58) Field of Classification Search

CPC ..... G11C 16/08; G11C 5/063; G11C 11/5628; G11C 13/0028; G11C 13/0069; G11C 16/10; G11C 16/12; G11C 16/3459; G11C 16/0483; G11C 16/24; G11C 16/34; G11C 16/3418

See application file for complete search history.

(56) References Cited

U.S. PATENT DOCUMENTS

| | | | | |
|---|---|---|---|---|
| 2015/0146487 A1* | 5/2015 | Jung | .................. | G11C 16/0483<br>365/185.11 |
| 2020/0342946 A1* | 10/2020 | Zhao | .................. | G11C 16/3459 |
| 2024/0079062 A1* | 3/2024 | Guo | .................. | G11C 16/0483 |

FOREIGN PATENT DOCUMENTS

| | | |
|---|---|---|
| KR | 1020180099012 A | 9/2018 |
| KR | 1020180099018 A | 9/2018 |

* cited by examiner

*Primary Examiner* — Donald HB Braswell
(74) *Attorney, Agent, or Firm* — WILLIAM PARK AND ASSOCIATES LTD.

(57) ABSTRACT

An embodiment relates to a memory device and a method of operating the memory device. The memory device includes a memory block including a plurality of pages respectively corresponding to a plurality of word lines, peripheral circuits configured to apply operation voltages to the plurality of word lines and sequentially discharge or simultaneously discharge the plurality of word lines during a program operation, and control logic configured to control the peripheral circuits to sequentially discharge or simultaneously discharge the plurality of word lines based on whether a selected page among the plurality of pages is included in a weak page group during the program operation.

12 Claims, 15 Drawing Sheets

MEMORY DEVICE AND METHOD OF OPERATING THE MEMORY DEVICE TO REDUCE PROGRAM DISTURB EFFECTS

CROSS-REFERENCE TO RELATED APPLICATION

The present application claims priority under 35 U.S.C. § 119(a) to Korean patent application number 10-2022-0167052 filed on Dec. 2, 2022, in the Korean Intellectual Property Office, the entire disclosure of which is incorporated by reference herein.

BACKGROUND

1. Technical Field

The present disclosure generally relates to a memory device and a method of operating the same, and more particularly, to a program operation of the memory device.

2. Related Art

A memory device may be formed in a two-dimensional structure in which a memory string is horizontally arranged on a semiconductor substrate or a three-dimensional structure in which a memory string is vertically stacked on a semiconductor substrate. The memory device having the three-dimensional structure is a memory device designed to resolve an integration degree limit of the memory device having the two-dimensional structure, and may include a plurality of memory cells stacked in a vertical direction on the semiconductor substrate.

SUMMARY

According to an embodiment of the present disclosure, a memory device includes a memory block including a plurality of pages respectively corresponding to a plurality of word lines, peripheral circuits configured to apply operation voltages to the plurality of word lines and sequentially discharge or simultaneously discharge the plurality of word lines during a program operation, and control logic configured to control the peripheral circuits to sequentially discharge or simultaneously discharge the plurality of word lines based on whether a selected page among the plurality of pages is included in a weak page group during the program operation.

According to an embodiment of the present disclosure, a method of operating a memory device includes sequentially applying a program voltage and a verify voltage to a selected word line corresponding to a selected page among a plurality of pages respectively corresponding to a plurality of word lines, determining whether the selected page is included in a weak page group, sequentially discharging the plurality of word lines when the selected page is included in the weak page group, and simultaneously discharging the plurality of word lines when the selected page is not included in the weak page group.

According to an embodiment of the present disclosure, a memory device includes a memory block including a plurality of pages respectively corresponding to a plurality of word lines, peripheral circuits configured to program the memory block by sequentially performing a plurality of program loops including a program voltage apply operation, a verify voltage apply operation, and a word line discharge operation during a program operation, and control logic configured to control the peripheral circuits to sequentially discharge the plurality of word lines or simultaneously discharge the plurality of word lines during the word line discharge operation, based on whether a program loop which is currently being performed during the program operation corresponds to a setting program state among a plurality of program states.

According to an embodiment of the present disclosure, a method of operating a memory device includes performing a program loop including a program voltage apply operation, a verify voltage apply operation, and a word line discharge operation on a selected page among a plurality of pages respectively corresponding to a plurality of word lines, determining whether the program loop corresponds to a setting program state among a plurality of program states, and performing a next program loop, and sequentially discharging the plurality of word lines during the word line discharge operation of the next program loop, when the program loop corresponds to the setting program state.

According to an embodiment of the present disclosure, a memory device includes a memory block including a plurality of pages respectively corresponding to a plurality of word lines, peripheral circuits configured to program the memory block by sequentially performing a plurality of program loops including a program voltage apply operation, a verify voltage apply operation, and a word line discharge operation during a program operation, and control logic configured to count the number of performed program loops and control the peripheral circuits to sequentially discharge or simultaneously discharge the plurality of word lines during the word line discharge operation based on the counted number of program loops.

According to an embodiment of the present disclosure, a method of operating a memory device includes performing a program loop including a program voltage apply operation, a verify voltage apply operation, and a word line discharge operation on a selected page among a plurality of pages respectively corresponding to a plurality of word lines, counting a performance number of the program loop performed up to an immediately previous time and comparing the counted performance number of the program loop with a set number, and performing a next program loop, and sequentially discharging the plurality of word lines during the word line discharge operation of the next program loop, when the counted performance number of the program loop exceeds the set number.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described with reference to the accompanying drawings.

An embodiment of the present disclosure provides a memory device and a method of operating the memory device capable of improving reliability of the memory device.

The present technology may improve reliability and an operation speed of a program operation of a memory device.

Figure 1:
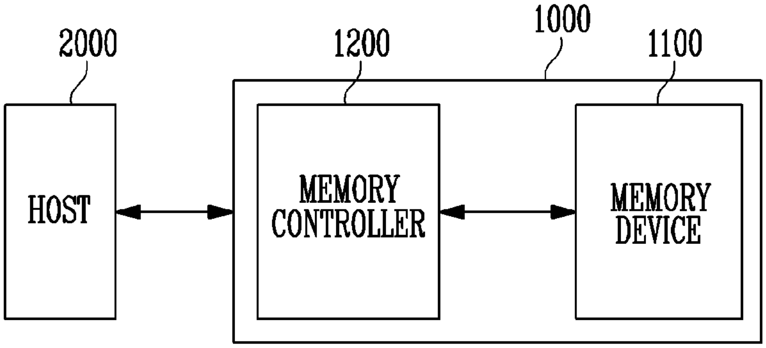
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 in which data is stored, and a memory controller 1200 that controls the memory device 1100 under control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA), or a serial attached SCSI (SAS). In addition, the interface protocols between the host 2000 and the memory system 1000 are not limited to the above-described examples, and may be one of other interface protocols such as a universal serial bus (USB), a multi-media card (MMC), an enhanced small disk interface (ESDI), or integrated drive electronics (IDE).

The memory controller 1200 may control an overall operation of the memory system 1000, and may control data exchange between the host 2000 and the memory device 1100. For example, the memory controller 1200 may program or read data by controlling the memory device 1100 according to a request of the host 2000. According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may perform a program, read, or erase operation under control of the memory controller 1200.

Figure 2:
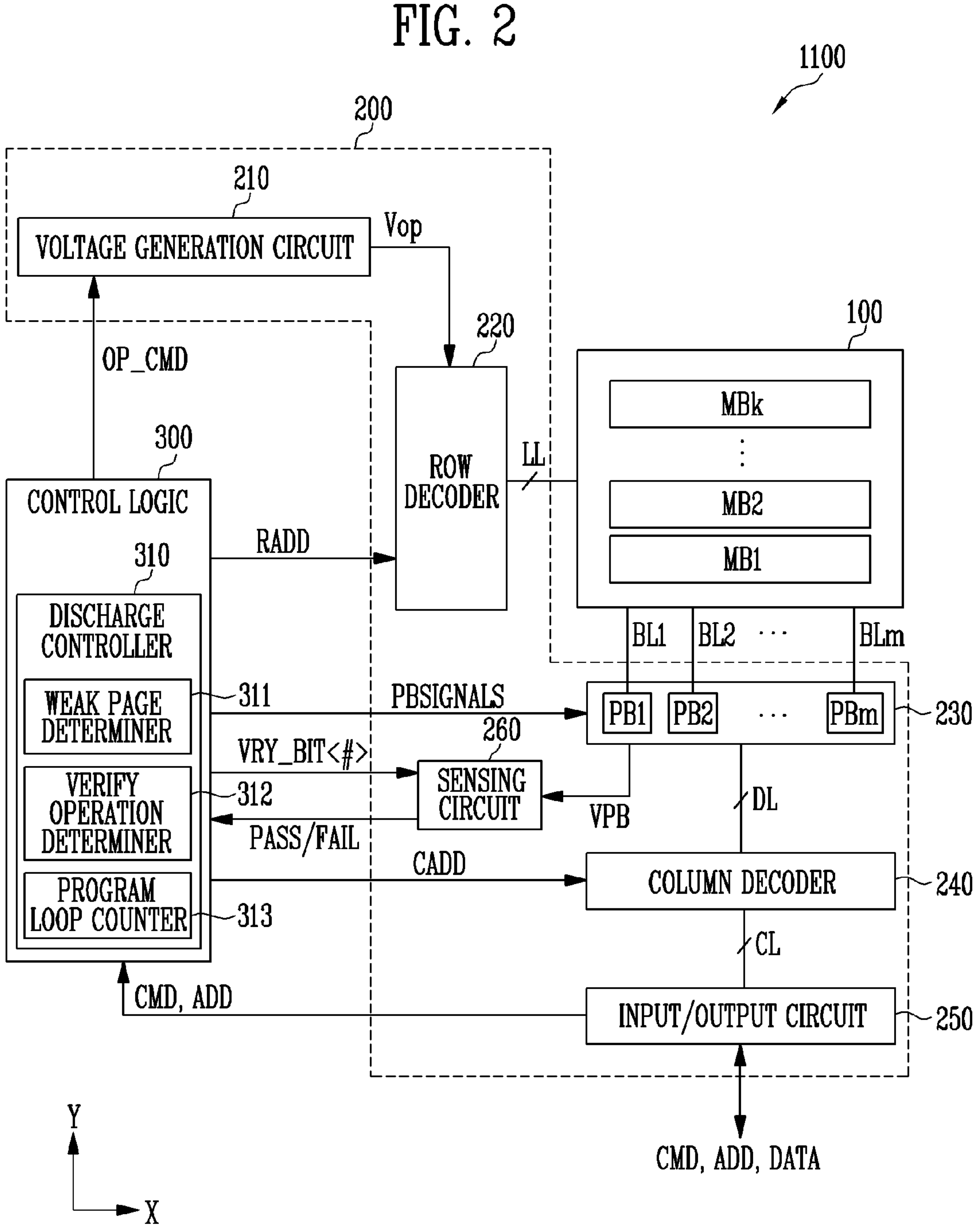
FIG. 2 is a diagram illustrating a memory device of FIG. 1.

FIG. 2 is a diagram illustrating the memory device of FIG. 1.

Referring to FIG. 2, the memory device 1100 may include the memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include control logic 300 that controls the peripheral circuits 200 according to the control of the memory controller 1200 of FIG. 1. The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks MB1 to MBk (k is a positive integer). Local lines LL and bit lines BL1 to BLm (m is a positive integer) may be connected to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. According to an embodiment of the present disclosure, the word lines may be divided into a plurality of groups. According to an embodiment of the present disclosure, during a verify operation of the program operation, the word lines may be sequentially discharged for each group or simultaneously discharged.

The local lines LL may be respectively connected to the memory blocks MB1 to MBk, and the bit lines BL1 to BLm may be commonly connected to the memory blocks MB1 to MBk. The memory blocks MB1 to MBk may be implemented in a two-dimensional or three-dimensional structure. For example, pages may be arranged in a direction parallel to a substrate in two-dimensional memory blocks. For example, the pages may be arranged in a direction vertical to the substrate in three-dimensional memory blocks.

The peripheral circuits 200 may be configured to perform the program, read, and erase operations of a selected memory block under control of the control logic 300. For example, the peripheral circuits 200 may supply a verify voltage and a pass voltage to a first select line, a second select line, and the word lines under the control of the control logic 300, selectively discharge the first select line, the second select line, and the word lines, and verify memory cells connected to a selected word line among the word lines. For example, the peripheral circuits 200 may include a voltage generation circuit 210, a row decoder 220, a page buffer group 230, a column decoder 240, an input/output circuit 250, and a sensing circuit 260.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, the verify voltage, the pass voltage, a turn-on voltage, a read voltage, a first erase voltage, a source line voltage, and the like under the control of the control logic 300. For example, during the verify operation, the voltage generation circuit 210 may adjust the source line voltage applied to a source line, the pass voltage applied to the source select lines and the drain select lines according to the control of the control logic 300, or sequentially discharge the word lines for each group or simultaneously discharge the word lines. For example, during the verify operation, the voltage generation circuit 210 may sequentially discharge the word lines when a selected page is included in a weak page group under the control of the control logic 300. In addition, during the verify operation, the voltage generation circuit 210 may simultaneously discharge the word lines when the selected page is not included in the weak page group under the control of the control logic 300. The weak page may be a page in which a program disturb occurs relatively greatly, and for example, the weak page may be a page including memory cells of which a horizontal width, that is, a critical dimension, of a channel structure corresponding to the memory cells is relatively small. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals of time at least partially overlap each other such that there exists a time at which the first and second processes are both taking place.

According to another embodiment, in a program operation repeatedly performing a program loop including a program voltage apply operation, a verify voltage apply operation, and a word line discharge operation, the voltage generation circuit 210 may simultaneously discharge the word lines during the word line discharge operation until the verify voltage apply operation corresponding to a setting program state is performed, and sequentially discharge the word lines during the word line discharge operation after the verify voltage apply operation corresponding to the setting program state is started. The setting program state may be a program state weak to a disturb phenomenon among a plurality of program states, and may be, for example, at least one program state having the highest threshold voltage distribution.

According to another embodiment, in the program operation repeatedly performing the program loop including the program voltage apply operation, the verify voltage apply operation, and the word line discharge operation, the voltage generation circuit 210 may simultaneously discharge the word lines during the word line discharge operation when the number of performed program loops is equal to or less than a setting number, and sequentially discharge the word lines during the word line discharge operation when the number of performed program loops exceeds the setting number.

The row decoder 220 may transmit the operation voltages Vop to the local lines LL connected to the selected memory block in response to row address RADD.

The page buffer group 230 may include a plurality of page buffers PB1 to PBm connected to the bit lines BL1 to BLm. The page buffers PB1 to PBm may operate in response to page buffer control signals PBSIGNALS. For example, the page buffers PB1 to PBm may temporarily store data received through the bit lines BL1 to BLm or sense a voltage or a current of the bit lines BL1 to BLm during the read or verify operation.

The column decoder 240 may transmit data between the input/output circuit 250 and the page buffer group 230 in response to a column address CADD. For example, the column decoder 240 may exchange data with the page buffers PB1 to PBm through data lines DL, or may exchange data with the input/output circuit 250 through column lines CL.

The input/output circuit 250 may transmit a command CMD and an address ADD received from the memory controller 1200 of FIG. 1 to the control logic 300 or may exchange the data DATA with the column decoder 240.

During the read operation or the verify operation, the sensing circuit 260 may generate a reference current in response to an allowable bit VRY_BIT<#>, compare a sensing voltage VPB received from the page buffer group 230 with a reference voltage generated by the reference current, and output a pass signal PASS or a fail signal FAIL.

The control logic 300 may output the operation signal OP_CMD, the row address RADD, the page buffer control signals PBSIGNALS, and the allowable bit VRY_BIT<#> in response to the command CMD and the address ADD to control the peripheral circuits 200. In addition, the control logic 300 may determine whether the verify operation is passed or failed in response to the pass signal PASS or the fail signal FAIL. In particular, during the verify operation, the control logic 300 may adjust the source line voltage applied to the source line, the pass voltage applied to the source select lines and the drain select lines, and control the peripheral circuits 200 so that the word lines may be sequentially discharged for word line group corresponding to a page group or the word lines may be simultaneously discharged.

For example, during the program operation, the control logic 300 may control the peripheral circuits 200 to perform the verify operation of verifying the memory cells after the program voltage apply operation, and control the peripheral circuits 200 so that a voltage of the selected word line is increased in order to turn on all memory cells connected to the selected word line after the verify operation. Thereafter, the peripheral circuits 200 may be controlled to perform the word line discharge operation in which a potential level of the selected word line and unselected word lines is discharged to a level of 0V.

The control logic 300 may include a discharge controller 310, and the discharge controller 310 may control the peripheral circuits 200 to sequentially discharge the selected word line and the unselected word lines for each group or simultaneously discharge the selected word line and the unselected word lines during the word line discharge operation.

According to an embodiment, the discharge controller 310 may include a weak page determiner 311, and the weak page determiner 311 may determine whether the selected page is included in the weak page group during the program operation. The discharge controller 310 may control the peripheral circuits 200 to sequentially discharge the word lines for each group or simultaneously discharge the word lines during the word line discharge operation based on a determination result of the weak page determiner 311. For example, when it is determined that the selected page is included in the weak page group by the weak page determiner 311, the discharge controller 310 may control the peripheral circuits 200 to sequentially discharge the word lines for each group, and when it is determined that the selected page is not included in the weak page group by the weak page determiner 311, the discharge controller 310 may control the peripheral circuits 200 to simultaneously discharge the word lines.

According to another embodiment, the discharge controller 310 may include a verify operation determiner 312, and the verify operation determiner 312 may determine whether the verify voltage apply operation of the program loop which is currently performed during the program operation corresponds to the verify voltage apply operation corresponding to the setting program state to determine whether the program loop which is currently performed corresponds to the setting program state. For example, when the verify voltage used during the verify voltage apply operation corresponds to the setting program state, the verify operation determiner 312 may determine that the program loop which is currently performed corresponds to the setting program state.

The discharge controller 310 may control the peripheral circuits 200 to sequentially discharge the word lines for each group or simultaneously discharge the word lines during the word line discharge operation based on a determination result of the verify operation determiner 312. For example, when it is determined that the verify voltage apply operation of the program loop which is currently performed corresponds to the setting program state by the verify operation determiner 312, the discharge controller 310 may control the peripheral circuits 200 to sequentially discharge the word lines for each group, and when it is determined that the verify voltage apply operation of the program loop which is currently performed corresponds to a program state of which a threshold voltage distribution is lower than that of the setting program state by the verify operation determiner 312, the discharge controller 310 may control the peripheral circuits 200 to simultaneously discharge the word lines.

According to still another embodiment, the discharge controller 310 may include a program loop counter 313, and the program loop counter 313 may count the number of program loops performed so far during the program operation. When the number of program loops counted by the program loop counter 313 exceeds the setting number, the discharge controller 310 may control the peripheral circuits 200 to sequentially discharge the word lines for each group during the word line discharge operation, and when the number of program loops counted by the program loop counter 313 is equal to or less than the setting number, the discharge controller 310 may control the peripheral circuits 200 to simultaneously discharge the word lines during the word line discharge operation.

Figure 3:
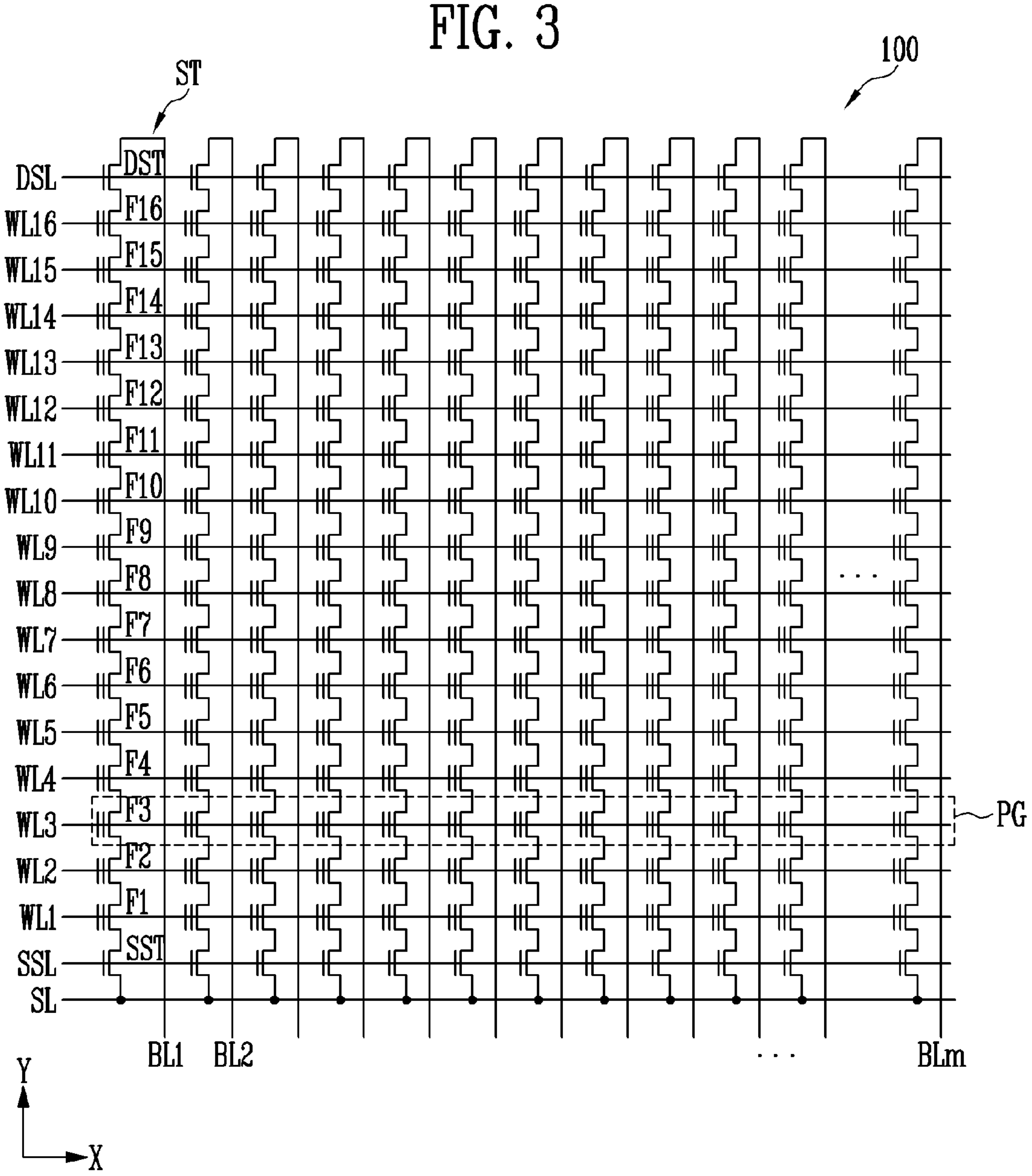
FIG. 3 is a diagram illustrating a memory block of FIG. 2.

FIG. 3 is a diagram illustrating the memory block of FIG. 2.

Referring to FIG. 3, the memory block may be connected to a plurality of word lines arranged in parallel with each other between the first select line and the second select line. Here, the first select line may be a source select line SSL, and the second select line may be a drain select line DSL. More specifically, the memory block may include a plurality of memory strings ST connected between the bit lines BL1 to BLm and a source line SL. The bit lines BL1 to BLm may be connected to the memory strings ST, respectively, and the source line SL may be commonly connected to the memory strings ST. Since the memory strings ST may be configured identically to each other, a memory string ST connected to a first bit line BL1 is specifically described as an example.

The memory string ST may include a source select transistor SST, a plurality of memory cells F1 to F16, and a drain select transistor DST connected in series between the source line SL and the first bit line BL1. One memory string ST may include at least one or more of the source select transistor SST and the drain select transistor DST, and may include the memory cells F1 to F16 more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different memory strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different memory strings ST may be referred to as a page PG. Therefore, the memory block may include the pages PG of the number of the word lines WL1 to WL16.

Figure 4:
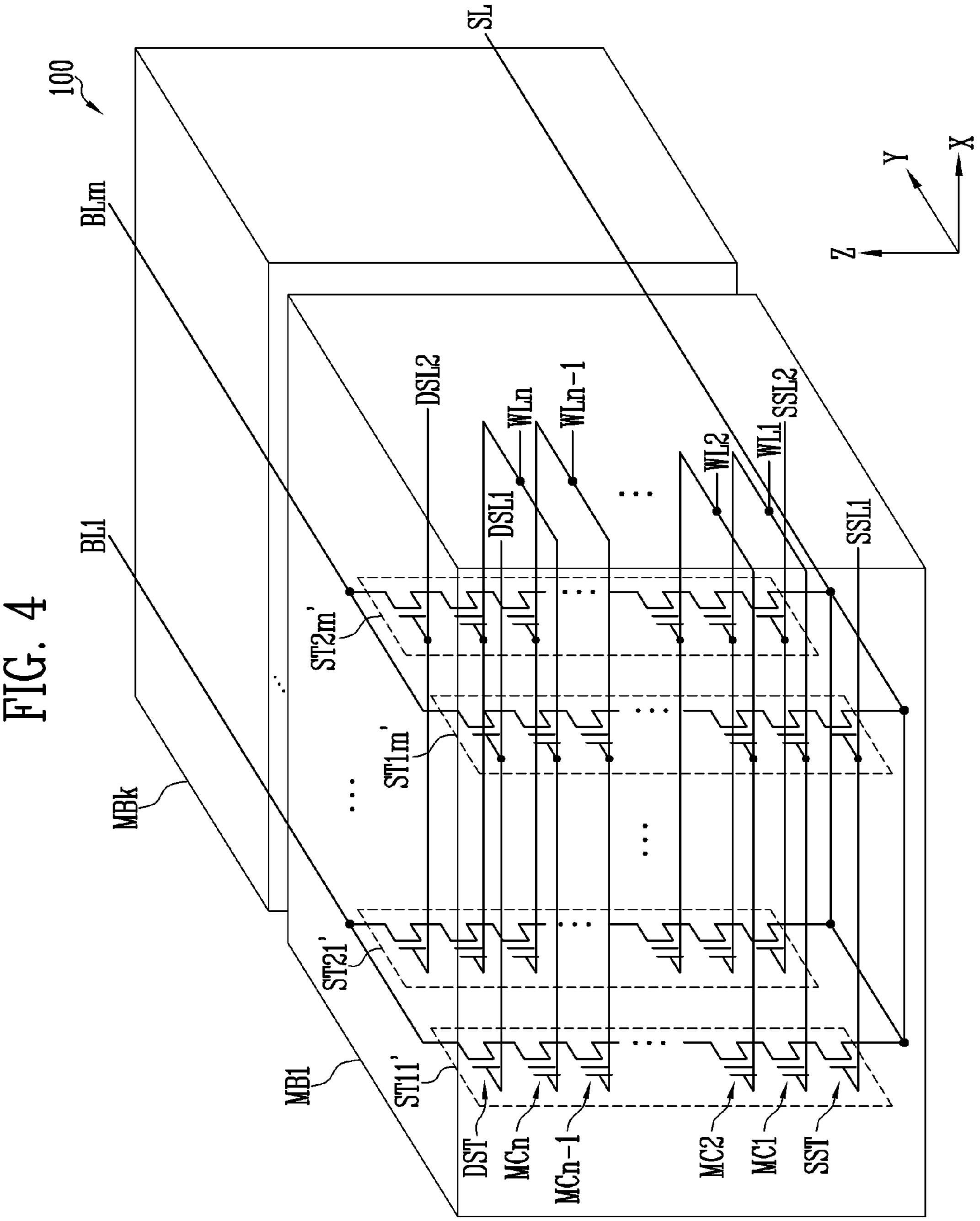
FIG. 4 is a diagram illustrating an embodiment of a memory block configured in a three dimension.

FIG. 4 is a diagram illustrating an embodiment of a memory block configured in a three dimension.

Referring to FIG. 4, the memory cell array 100 may include a plurality of memory blocks MB1 to MBk. In FIG. 4, for ease of understanding, an internal configuration of a first memory block MB1 is shown, and an internal configuration of the remaining memory blocks MB2 to MBk is omitted. Second to k-th memory blocks MB2 to MBk may also be configured identically to the first memory block MB1.

The first memory block MB1 may include a plurality of memory strings ST11' to ST1*m*' and ST21' to ST2*m*'. Each of the plurality of memory strings ST11' to ST1*m*' and ST21' to ST2*m*' may extend along a vertical direction (Z direction). In the first memory block MB1, m memory strings may be arranged in a row direction (X direction). In FIG. 4, two memory strings are arranged in a column direction (Y direction), but this is for convenience of description, and three or more memory strings may be arranged in the column direction (Y direction).

Each of the plurality of memory strings ST11' to ST1*m*' and ST21' to ST2*m*' may include at least one source select transistor SST, first to n-th memory cells MC1 to MCn, and at least one drain select transistor DST.

The source select transistor SST of each memory string may be connected between the source line SL and the memory cells MC1 to MCn. The source select transistors of the memory strings arranged in the same row may be connected to the same source select line. The source select transistors of the memory strings ST11' to ST1*m*' arranged in a first row may be connected to a first source select line SSL1. The source select transistors of the memory strings ST21' to ST2*m*' arranged in a second row may be connected to a second source select line SSL2. As another embodiment, the source select transistors of the memory strings ST11' to ST1*m*' and ST21' to ST2*m*' may be commonly connected to one source select line.

The first to n-th memory cells MC1 to MCn of each memory string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding memory string may be stably controlled. Accordingly, reliability of data stored in the memory block MB1 may be improved.

The drain select transistor DST of each memory string may be connected between the bit line and the memory cells MC1 to MCn. The drain select transistor DST of the memory strings arranged in the row direction may be connected to the drain select line extending in the row direction. The drain select transistors DST of the memory strings ST11' to ST1m' of the first row may be connected to a first drain select line DSL1. The drain select transistors DST of the memory strings ST21' to ST2m' of the second row may be connected to a second drain select line DSL2.

Figure 5:
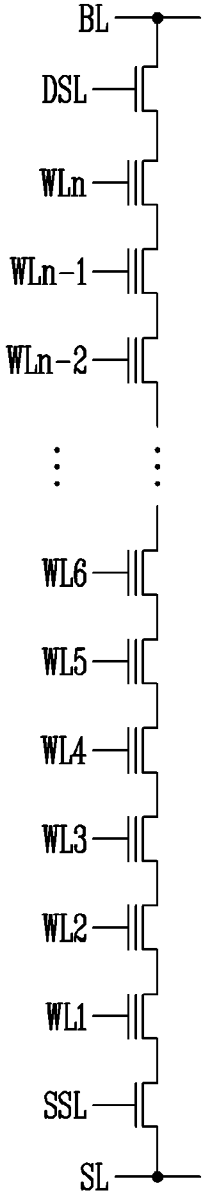
FIG. 5 is a diagram illustrating a memory string.

FIG. 5 is a diagram illustrating the memory string.

Figure 6:
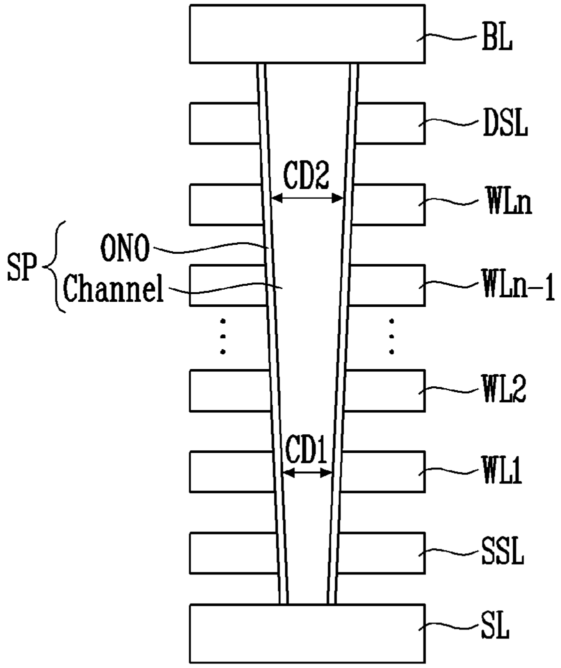
FIG. 6 is a cross-sectional view of the memory string shown in FIG. 5.

FIG. 6 is a cross-sectional view of the memory string shown in FIG. 5.

Referring to FIGS. 5 and 6, the source line SL is formed on a semiconductor substrate. A vertical channel Channel is formed on the source line SL. An upper portion of the vertical channel Channel is connected to a bit line BL. The vertical channel Channel may be formed of polysilicon. A plurality of conductive layers may be formed to surround the vertical channel Channel at different heights of the vertical channel Channel, and the plurality of conductive layers may be defined as the source select line SSL, the plurality of word lines WL1 to WLn, and the drain select line DSL. A memory layer ONO including a charge storage layer is formed on a surface of the vertical channel Channel, and the memory layer ONO is also positioned between the vertical channel Channel and the conductive layers. A vertical channel structure SP may include the vertical channel Channel and the memory layer ONO.

A lowermost conductive layer may be defined as the source select line SSL, and an uppermost conductive layer may be defined as the drain select line DSL. Conductive layers between the source select line SSL and the drain select line DSL may be defined as the word lines WL1 to WLn, and at least one conductive layer disposed on an uppermost portion of the word lines WL1 to WLn, at least one conductive layer disposed at a lowermost portion, and at least one conductive layer disposed at a middle portion may be defined as a dummy word line.

The source select transistor is formed at a portion where the source select line SSL surrounds the vertical channel Channel, and the drain select transistor is formed at a portion where the drain select line DSL surrounds the vertical channel Channel. The memory cells are formed at portions where the word lines WL1 to WLn surround the vertical channel Channel.

The vertical channel Channel of the memory string described above may have a structure in which a width of an upper portion is greater than a width of a lower portion. For example, a channel width CD1 of the memory cell corresponding to the word line WL1 may be smaller than a channel width CD2 of the memory cell corresponding to the word line WLn, and a channel width of the memory cell may decrease as the memory cell is adjacent to the drain select transistor and the semiconductor substrate.

Figure 7:
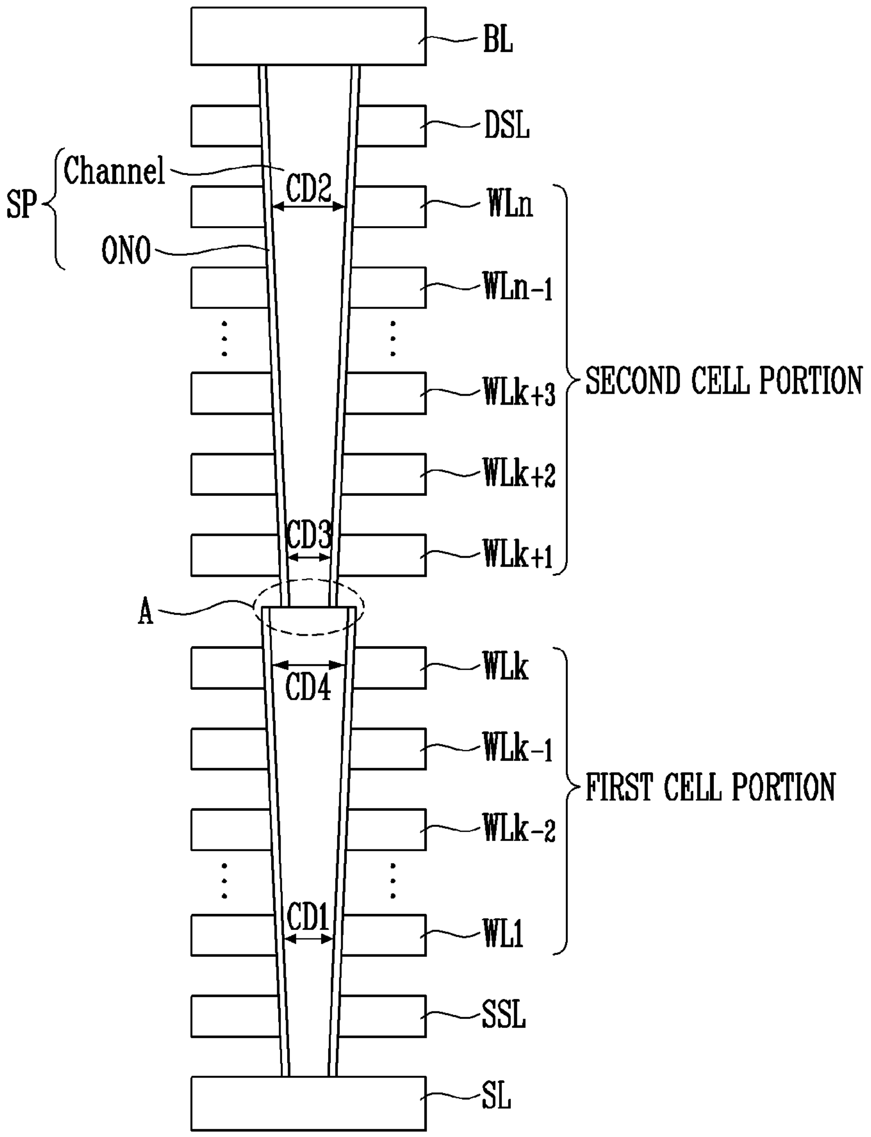
FIG. 7 is a cross-sectional view illustrating another structure of the memory string shown in FIG. 5.

FIG. 7 is a cross-sectional view illustrating another structure of the memory string shown in FIG. 5.

Referring to FIG. 7, the source line SL is formed on the semiconductor substrate. The vertical channel Channel is formed on the source line SL. An upper portion of the vertical channel Channel is connected to the bit line BL. The vertical channel Channel may be formed of polysilicon. A plurality of conductive layers may be formed to surround the vertical channel Channel at different heights of the vertical channel Channel, and the plurality of conductive layers may be defined as the source select line SSL, the plurality of word lines WL1 to WLn, and the drain select line DSL. The memory layer ONO including the charge storage layer is formed on the surface of the vertical channel Channel, and the memory layer ONO is also positioned between the vertical channel Channel and the conductive layers. The vertical channel structure SP may include the vertical channel Channel and the memory layer ONO.

The lowermost conductive layer becomes the source select line SSL, and the uppermost conductive layer becomes the drain select line DSL. Conductive layers between the drain select line DSL and the source select line SSL become the word lines WL1 to WLn.

The source select transistor is formed at a portion where the source select line SSL surrounds the vertical channel Channel, and the drain select transistor is formed at a portion where the uppermost conductive layer DSL surrounds the vertical channel Channel. The memory cells are formed at portions where the word lines WL1 to WLn surround the vertical channel Channel.

The above-described memory string may be divided into a first cell portion and a second cell portion. The second cell portion has a structure stacked on an upper end portion of the first cell portion. At this time, a channel width CD4 of a memory cell positioned at an uppermost end of the first cell portion is different from a channel width CD3 of a memory cell positioned at a lowermost end of the second cell portion. More specifically, the channel width CD4 of the memory cell positioned at the uppermost end of the first cell portion is greater than the channel width CD3 of the memory cell positioned at the lowermost end of the second cell portion.

In addition, a channel width of the memory cells of the first cell portion may decrease as the memory cells are adjacent to the source select transistor and the semiconductor substrate, and a channel width of the memory cells of the second cell portion may decrease as the memory cells are adjacent to the first cell portion. For example, among the memory cells of the first cell portion, the channel width CD1 of the memory cell corresponding to the word line WL1 may be smaller than the channel width CD4 of the memory cell corresponding to the word line WLk, and the channel width of the memory cell may decrease as the memory cell is adjacent to the source select transistor and the semiconductor substrate. In addition, among the memory cells of the second cell portion, the channel width CD3 of the memory cell corresponding to a word line WLk+1 may be smaller than the channel width CD2 of the memory cell corresponding to the word line WLn, and the channel width of the memory cell may increase as the memory cell is adjacent to the drain select transistor.

Figure 8:
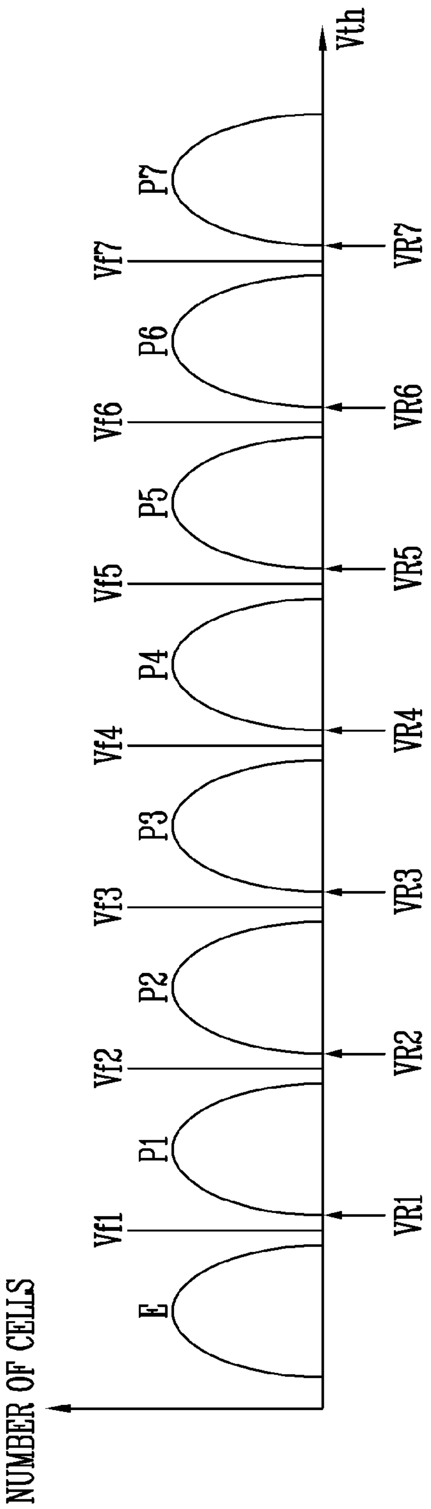
FIG. 8 is a graph illustrating program states of a triple level cell.

FIG. 8 is a graph illustrating program states of a triple level cell (TLC).

Referring to FIG. 8, the TLC has threshold voltage stages corresponding to respective one erase state E and seven program states P1 to P7. The erase state E and the first to seventh program states P1 to P7 have corresponding bit codes. Various bit codes may be assigned to the erase state E and the first to seventh program states P1 to P7 as occasion demands.

Each of the threshold voltage states may be distinguished based on first to seventh read voltages VR1 to VR7. In addition, first to seventh verify voltages Vf1 to Vf7 may be used to determine whether memory cells corresponding to respective program states are programmed.

For example, in order to verify memory cells corresponding to the second program state P2 among memory cells included in a selected physical page, the second verify voltage Vf2 is applied to the word line. At this time, the memory cells corresponding to the second program state P2 may be distinguished by the page buffers PB1 to PBm shown in FIG. 2.

A threshold voltage of the memory cell is determined by applying the second verify voltage Vf2 to the word line and sensing a potential or a current amount of the bit line, and when it is determined that the threshold voltage of the memory cell is greater than the second verify voltage Vf2, the page buffer applies a program inhibit voltage to a corresponding bit line. Therefore, even though a program pulse is applied to the word line, the threshold voltage of the corresponding memory cell does not increase any more.

Whether program is completed on memory cells to be programmed to the first to seventh program states P1 to P7, that is, determination of pass/fail during the verify operation may be performed by the sensing circuit 260 of FIG. 2. For example, during the verify operation for the second program state P2, the sensing circuit 260 determines whether the verify operation for the second program state P2 is passed or failed, by comparing the reference voltage based on the reference current corresponding to the number of memory cells to be programmed to the second program state P2 and the sensing voltage VPB based on the sensing current corresponding to the number of memory cells having a threshold voltage higher than the second verify voltage Vf2 among the memory cells to be programmed to the second program state P2.

In FIG. 8, target program states of the TLC is shown, but this is an example, and a plurality of memory cells included in the memory device according to an embodiment of the present disclosure may be multi-level cells (MLCs). In another embodiment, the plurality of memory cells included in the memory device according to an embodiment of the present disclosure may be quad-level cells (QLCs).

In an embodiment of the present disclosure, at least one program state of which a threshold voltage distribution is the highest among one erase state and a plurality of program states may be defined as the setting program state. For example, when the plurality of memory cells are TLCs, the seventh program state P7 of which a threshold voltage distribution is the highest among the one erase state E and the seven program states P1 to P7 may be defined as the setting program state. For example, when the plurality of memory cells are the QLCs, a fourteenth program state and a fifteenth program state of which a threshold voltage distribution is the highest among one erase state and 15 program states may be the setting program states.

Figure 9:
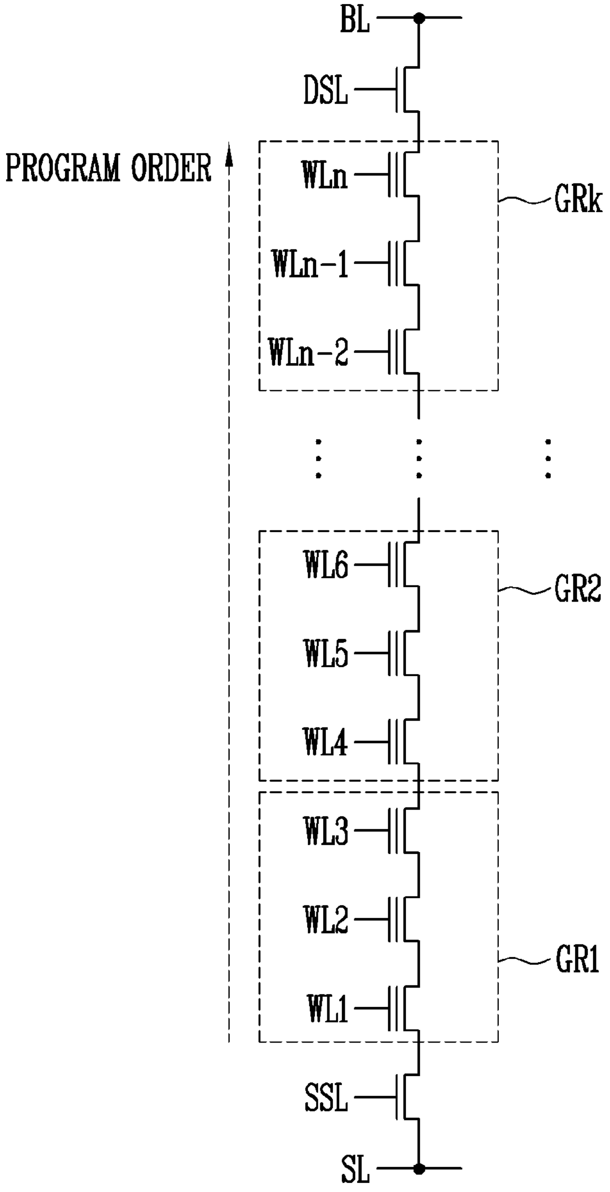
FIG. 9 is a diagram illustrating page groups according to an embodiment of the present disclosure.

FIG. 9 is a diagram illustrating page groups according to an embodiment of the present disclosure.

Referring to FIG. 9, the plurality of pages corresponding to the word lines WL1 to WLn may be divided into a plurality of page groups GR1 to GRk (k is a positive integer), and word lines corresponding to one page group may be defined as one word line group. That is, the plurality of word lines WL1 to WLn may be divided into a plurality of word line groups respectively corresponding to the plurality of page groups GR1 to GRk. Assuming that each page group includes pages corresponding to three word lines, the pages corresponding to the first to third word lines WL1 to WL3 may be included in the first page group GR1, the pages corresponding to the fourth to sixth word lines WL4 to WL6 may be included in the second page group GR2. In such a method, the pages corresponding to the (n−2)-th to n-th word lines WLn−2 to WLn may be included in the k-th page group GRk. The first page group GR1 adjacent to the source line SL and the k-th page group GRk adjacent to the bit line BL may include a dummy page. In addition, a page group disposed in an intermediate position among the plurality of page groups GR1 to GRk may include a dummy page.

The program operation may be sequentially performed from the first word line WL1 to the n-th word line WLn. Alternatively, the program operation may be performed in a reverse direction.

At least one page group among the plurality of page groups GR1 to GRk described above may be defined as the weak page group. The weak page group may be a page in which a program disturb effect is large during the program operation. The weak page group may be defined as a page group including the memory cells of which the channel width is relatively small as shown in FIGS. 6 and 7. For example, the first page group GR1 adjacent to the source line SL may be defined as the weak page group. For example, a page group including the memory cells disposed at a lower end portion of the second cell portion may be defined as the weak page group.

Figure 10:
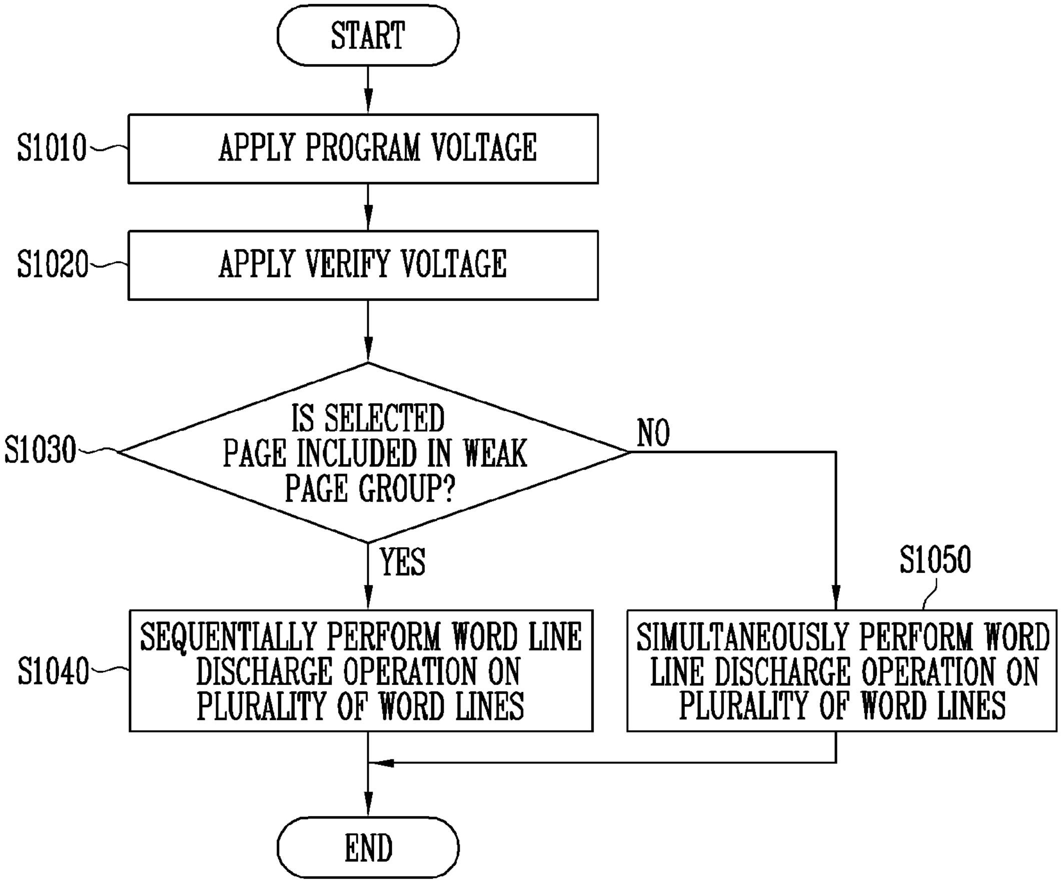
FIG. 10 is a flowchart illustrating a program operation of a memory device according to an embodiment.

FIG. 10 is a flowchart illustrating a program operation of a memory device according to an embodiment.

Figure 11:
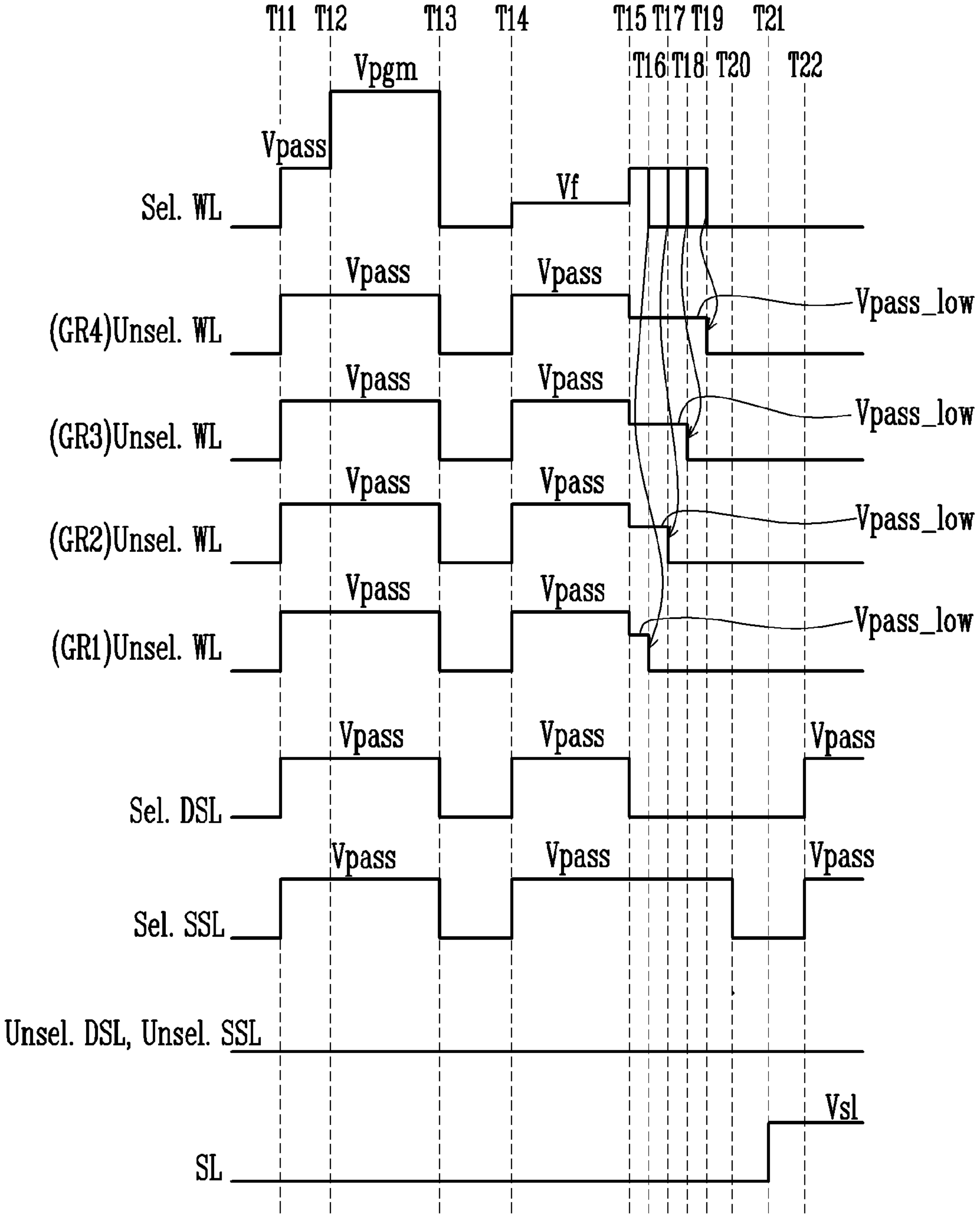
FIG. 11 is a waveform diagram of signals illustrating the program operation of the memory device.

FIG. 11 is a waveform diagram of signals illustrating the program operation of the memory device. For example, T11 to T13 may be a program voltage apply period, T14 to T15 may be a verify voltage apply period, and T15 to T19 may be a word line discharge period. T14 to T20 may be defined as a verify operation period.

The program operation of the memory device according to an embodiment of the present disclosure is described with reference to FIGS. 2 to 11.

In step S1010, a program voltage Vpgm is applied to a selected word line Sel. WL corresponding to the selected page.

For example, the page buffers PB1 to PBm receive data to be programmed, and apply a program allowable voltage or a program inhibit voltage to the bit lines BL1 to BLm based on the received program data. For example, the program allowable voltage may be 0V, and the program inhibit voltage may be a positive voltage (for example, power supply voltage for the memory device VCC).

The voltage generation circuit 210 may generate a pass voltage Vpass in response to the operation signal OP_CMD, and the row decoder 220 may transmit the pass voltage Vpass to the local lines LL connected to the selected memory block (for example, MB1) in response to the row address RADD. Accordingly, the pass voltage Vpass may be applied to the selected word line Sel. WL, unselected word lines Unsel. WL, selected source select lines Sel. SSL, and selected drain select lines Sel. DSL of the selected memory block MB1 (T11 to T12). The pass voltage Vpass or 0V may be selectively applied to unselected source select lines Unsel. SSL and unselected drain select lines Unsel. DSL. In T11 to T21, the source line SL may be controlled as 0V.

Here, the selected word line Sel. WL may be a word line connected to a target page of the program operation, and the unselected word lines Unsel. WL may be word lines except for the selected word lines Sel. WL. The selected source select lines Sel. SSL and the selected drain select lines Sel. DSL may be source select lines and drain select lines connected to memory strings including memory cells to be programmed, and the unselected source select lines Unsel. SSL and the unselected drain select lines Unsel. DSL may be source select lines and drain select lines connected to remaining memory strings.

The voltage generation circuit 210 generates a program voltage Vpgm in response to the operation signal OP_CMD, and the row decoder 220 applies the program voltage Vpgm to the selected word line Sel. WL of the selected memory block MB1 in response to the row address RADD (T12 to T13).

When the program voltage Vpgm is applied to the selected word line Sel. WL during a certain time, the word lines, the source select line, and the drain select lines may be discharged to 0V for a next operation (T13 to T14).

In step S1020, a verify voltage Vf is applied to the selected word line Sel. WL corresponding to the selected page.

The voltage generation circuit 210 generates the verify voltage Vf and the pass voltage Vpass in response to the operation signal OP_CMD, and the row decoder 220 applies the verify voltage Vf to the selected word line Sel. WL of the selected memory block MB1 and applies the pass voltage Vpass to the unselected word lines Unsel. WL, the selected source select lines Sel. SSL, and the selected drain select lines Sel. DSL of the selected memory block MB1, in response to the row address RADD (T14 to T15). The verify voltage Vf may be any one of the plurality of verify voltages Vf1 to Vf7 corresponding to the plurality of program states P1 to P7.

The page buffers PB1 to PBm sense a potential or a current amount of the bit lines BL1 to BLm to perform the verify operation for the program state corresponding to the verify voltage Vf.

In step S1030, the discharge controller 310 of the control logic 300 determines whether the selected page is included in the weak page group. For example, the discharge controller 310 of the control logic 300 checks whether the selected page is included in the first page group GR1 weak to the program disturb phenomenon.

In an embodiment of the present disclosure, the first page group GR1 is defined as the weak page, but is not limited thereto, and at least one page group including the memory cells of which the channel width of the memory cell is relatively small as shown in FIGS. 5 and 6 may be defined as the weak page group. For example, a page group including the first page group GR1 disposed at the lower end portion of the first cell portion and a page group including the memory cells disposed at the lower end portion of the second cell portion may be defined as the weak page group.

As a result of the determination of the above-described step S1030, when it is determined that the selected page is included in the weak page group (Yes), the plurality of word lines WL1 to WLn of the selected memory block MB1 are sequentially discharged in step S1040.

For example, a voltage higher than the verify voltage Vf may be applied to the selected word line Sel. WL in T15 to T16, and a potential level of the unselected word lines Unsel. WL may be decreased to be controlled as a low pass voltage Vpass_low. Accordingly, a potential level of the selected word line Sel. WL and the potential level of the unselected word lines Unsel. WL may be controlled to be similar. A voltage of 0V may be applied to the selected drain select lines Sel. DSL.

In T16 to T20, the plurality of word lines WL1 to WLn corresponding to the plurality of page groups GR1 to GRk may be sequentially discharged for each word line group respectively corresponding to the page group. For example, the word lines corresponding to the first page group GR1 may be discharged to 0V, and then the word lines corresponding to the second page group GR2 may be discharged to 0V. Thereafter, the word lines corresponding to the third page group GR3 may be discharged to 0V, and then the word lines corresponding to the fourth page group GR4 may be discharged to 0V.

As another embodiment, each of the plurality of word lines WL1 to WLn may be sequentially discharged. That is, the word line WL1 may be discharged to 0V, and then the word line WL2 may be discharged to 0V. Thereafter, the word line WL3 may be discharged to 0V, and then the word line WL4 may be discharged to 0V.

As described above, when the selected page is included in the weak page group, the plurality of word lines WL1 to WLn may be sequentially discharged in a word line group unit corresponding to the page group or in one word line unit.

FIG. 11 shows that when the first to fourth page groups GR1 to GR4 are defined as the weak page groups, the word line discharge operation is sequentially performed for each word line group, and the word line groups corresponding to the remaining page groups except for the first to fourth page groups GR1 to GR4 may also be sequentially discharged for each word line group after the discharge operation of the word line group corresponding to the fourth page group GR4.

After the discharge operation of the word line, the voltage of 0V may be applied to the selected source select lines Sel. SSL at T20.

As a result of the determination of the above-described step S1030, when it is determined that the selected page is not included in the weak page group (No), the plurality of word lines WL1 to WLn of the selected memory block MB1 are simultaneously discharged in step S1050.

For example, a voltage higher than the verify voltage Vf may be applied to the selected word line Sel. WL in T15 to T16, and a potential level of the unselected word lines Unsel. WL may be decreased to be controlled as the low pass voltage Vpass_low. Accordingly, the potential level of the selected word line Sel. WL and the potential level of the unselected word lines Unsel. WL may be controlled to be similar. The voltage of 0V may be applied to the selected drain select lines Sel. DSL.

Thereafter, the word lines corresponding to the plurality of page groups GR1 to GRk may be simultaneously discharged at T16. Accordingly, in an embodiment, an operation speed of the memory device may be improved.

Figure 12:
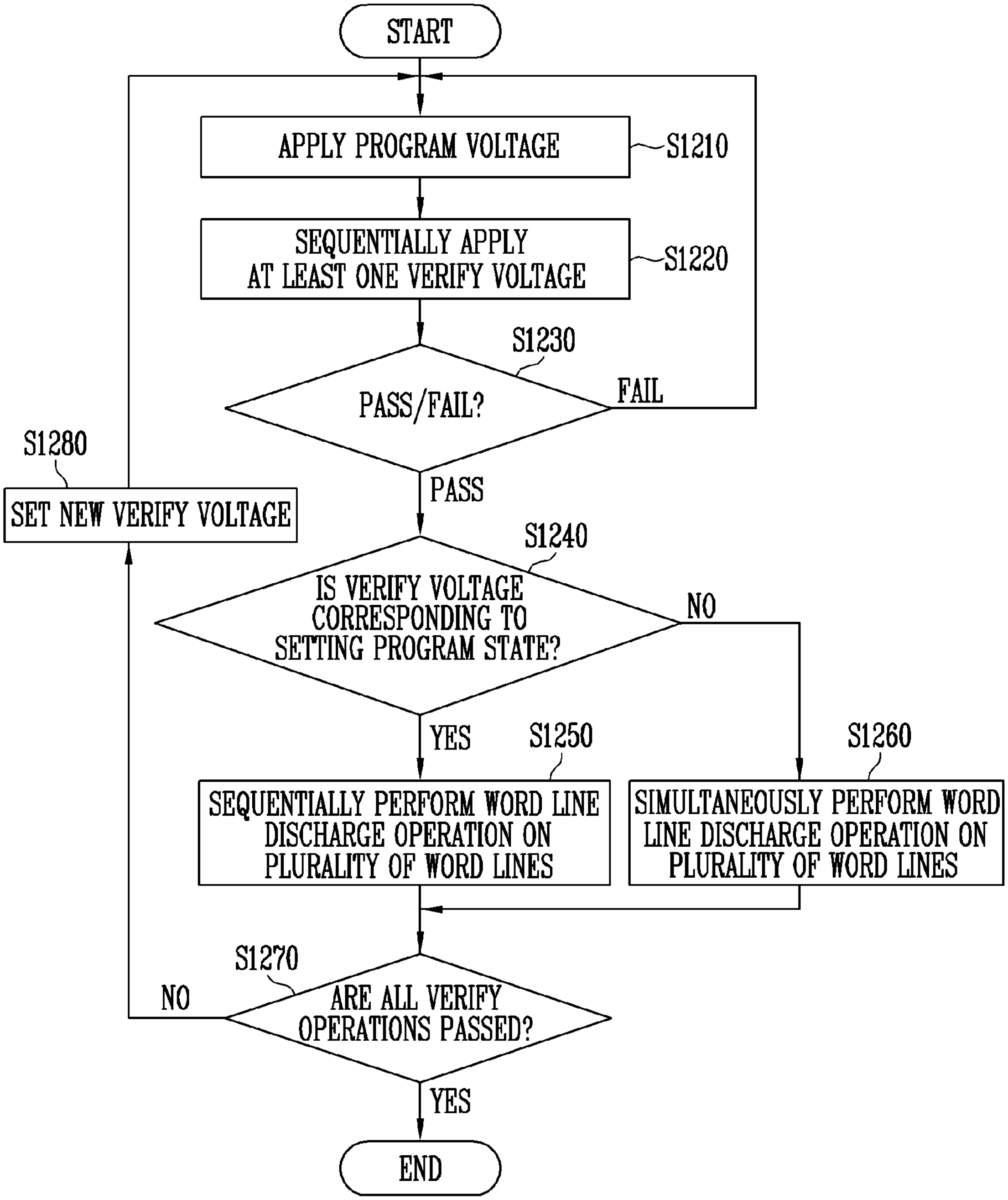
FIG. 12 is a flowchart illustrating a program operation of a memory device according to another embodiment of the present disclosure.

FIG. 12 is a flowchart illustrating a program operation of a memory device according to another embodiment of the present disclosure.

Figure 13:
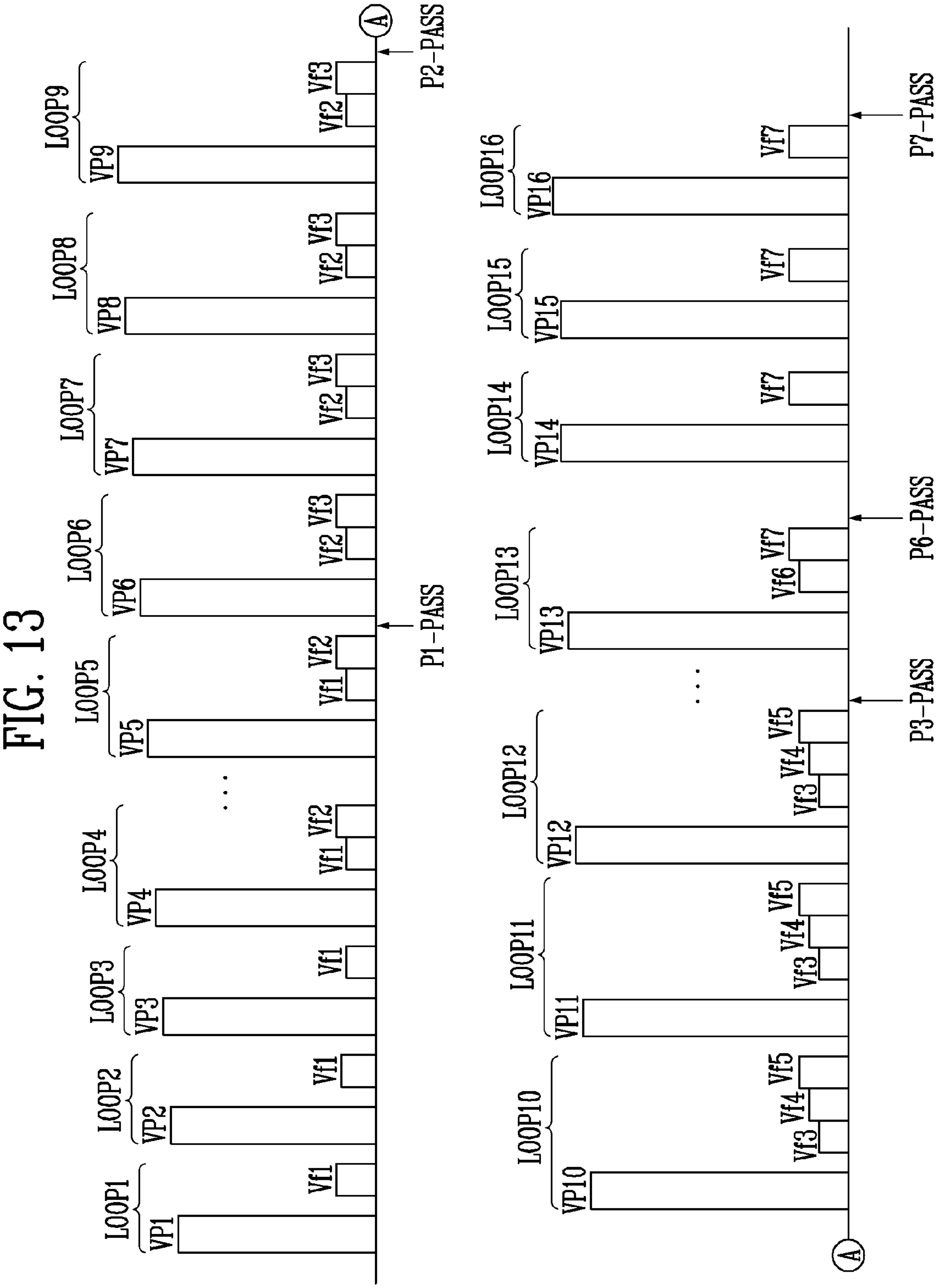
FIG. 13 is a diagram illustrating a plurality of program loops during the program operation of the memory device.

FIG. 13 is a diagram illustrating a plurality of program loops during the program operation of the memory device.

The program operation of the memory device according to another embodiment of the present disclosure is described with reference to FIGS. 2 to 5, 8, and 11 to 13.

FIG. 11 shows one program loop. For example, T11 to T13 may be a program voltage apply period, T14 to T15 may be a verify voltage apply period, and T15 to T19 may be a word line discharge period. T14 to T20 may be defined as a verify operation period.

FIG. 13 shows a plurality of program loops LOOP1 to LOOP16 configuring the program operation of the selected page. The program operation may be performed in an incremental step pulse program (ISPP) method in which the program voltage increases step by step as the performance number of the program loop increases.

In step S1210, a program voltage Vpgm is applied to a selected word line Sel. WL corresponding to the selected page. That is, the program voltage apply operation of the first program loop LOOP1 is performed.

For example, the page buffers PB1 to PBm receive data to be programmed, and apply a program allowable voltage or a program inhibit voltage to the bit lines BL1 to BLm based on the received program data. For example, the program allowable voltage may be 0V, and the program inhibit voltage may be a positive voltage (for example, VCC).

The voltage generation circuit 210 may generate a pass voltage Vpass in response to the operation signal OP_CMD, and the row decoder 220 may transmit the pass voltage Vpass to the local lines LL connected to the selected memory block (for example, MB1) in response to the row address RADD. Accordingly, the pass voltage Vpass may be applied to the selected word line Sel. WL, unselected word lines Unsel. WL, selected source select lines Sel. SSL, and selected drain select lines Sel. DSL of the selected memory block MB1 (T11 to T12). The pass voltage Vpass or 0V may be selectively applied to unselected source select lines Unsel. SSL and unselected drain select lines Unsel. DSL. In T11 to T21, the source line SL may be controlled as 0V.

Here, the selected word line Sel. WL may be a word line connected to a target page of the program operation, and the unselected word lines Unsel. WL may be word lines except for the selected word lines Sel. WL. The selected source select lines Sel. SSL and the selected drain select lines Sel. DSL may be source select lines and drain select lines connected to memory strings including memory cells to be programmed, and the unselected source select lines Unsel. SSL and the unselected drain select lines Unsel. DSL may be source select lines and drain select lines connected to remaining memory strings.

The voltage generation circuit 210 generates a program voltage Vpgm in response to the operation signal OP_CMD, and the row decoder 220 applies the program voltage Vpgm to the selected word line Sel. WL of the selected memory block MB1 in response to the row address RADD (T12 to T13).

When the program voltage Vpgm is applied to the selected word line Sel. WL during a certain time, the word lines, the source select line, and the drain select lines may be discharged to 0V for a next operation (T13 to T14).

In step S1220, at least one verify voltage is sequentially applied. That is, the verify voltage apply operation is performed, and at least one verify voltage set in the program loop which is currently performed is sequentially applied. For example, the first verify voltage Vf1 may be applied in the first program loop LOOP1 to the third program loop LOOP3, and the first verify voltage Vf1 and the second verify voltage Vf2 may be sequentially applied in the fourth program loop LOOP4 and the fifth program loop LOOP5. In addition, the sixth verify voltage Vf6 and the seventh verify voltage Vf7 may be sequentially applied in the thirteenth program loop LOOP13, and the seventh verify voltage Vf7 may be applied in the fourteenth program loop LOOP14 to the sixteenth program loop LOOP16.

The voltage generation circuit 210 generates at least one verify voltage and the pass voltage Vpass in response to the operation signal OP_CMD, and the row decoder 220 applies the at least one verify voltage to the selected word line Sel. WL of the selected memory block MB1 and applies the pass voltage Vpass to the unselected word lines Unsel. WL, the selected source select lines Sel. SSL, and the selected drain select lines Sel. DSL of the selected memory block MB1, in response to the row address RADD (T14 to T15). The at least one verify voltage may be at least one of the plurality of verify voltages Vf1 to Vf7 corresponding to the plurality of program states P1 to P7.

The page buffers PB1 to PBm sense a potential or a current amount of the bit lines BL1 to BLm to perform the verify operation for the program state corresponding to the verify voltage Vf.

In step S1230, a verify result of memory cells to be programmed to a threshold voltage higher than the verify voltage applied in the current program loop among the memory cells included in the selected page is determined.

For example, the page buffers PB1 to PBm sense the potential or the current amount of the corresponding bit lines BL1 to BLm, and outputs the sensing voltage VPB based on the sensing current corresponding to the number of memory cells programmed to the threshold voltage higher than the verify voltage applied in the current program loop. The sensing circuit 260 compares the reference voltage based on the reference current corresponding to the number of memory cells to be programmed to the program state corresponding to the verify voltage applied in the current program loop and the sensing voltage VPB to generate the pass signal PASS or the fail signal FAIL. The control logic 300 determines pass or fail of the currently performed verify operation based on the pass signal PASS or the fail signal FAIL.

When it is determined that the verify operation is fail (fail) as a result of the determination of the above-described step S1230, the program voltage Vpgm is increased by a step voltage, and then the program voltage apply operation of the program loop (step S1210) is performed again.

When it is determined that the verify operation is pass (pass) as a result of the determination of the above-described step S1230, it is checked whether the verify voltage applied during the verify voltage apply operation of the currently performed program loop is the verify voltage corresponding to the setting program state in step S1240. For example, the verify operation determiner 312 determines whether the verify voltage apply operation of the program loop which is currently performed is the verify voltage apply operation corresponding to the setting program state. For example, among the program states P1 to P7 of the TLC, the setting program state may be at least one program state of which the threshold voltage distribution is the highest, for example, the seventh program state P7, and the verify voltage corresponding to the setting program state may be the seventh verify voltage Vf7. That is, it is checked whether the seventh verify voltage Vf7 is applied during the verify voltage apply operation of the currently performed program loop. When the verify voltage corresponding to the setting program state is used during the verify voltage apply operation, it may be determined that the program loop which is currently performed corresponds to the setting program state.

As a result of the determination of the above-described step S1240, when it is determined that the verify voltage corresponding to the setting program state is applied (Yes), the plurality of word lines WL1 to WLn of the selected memory block MB1 are sequentially discharged in step S1250.

For example, a voltage higher than the verify voltage may be applied to the selected word line Sel. WL in T15 to T16, and a potential level of the unselected word lines Unsel. WL may be decreased to be controlled as a low pass voltage Vpass_low. Accordingly, a potential level of the selected word line Sel. WL and the potential level of the unselected word lines Unsel. WL may be controlled to be similar. A voltage of 0V may be applied to the selected drain select lines Sel. DSL.

In T16 to T20, the plurality of word lines WL1 to WLn corresponding to the plurality of page groups GR1 to GRk may be sequentially discharged for each word line group. For example, the word line group corresponding to the first page group GR1 may be discharged to 0V, and then the word line group corresponding to the second page group GR2 may be discharged to 0V. Thereafter, the word line group corresponding to the third page group GR3 may be discharged to 0V, and then the word line group corresponding to the fourth page group GR4 may be discharged to 0V.

As another embodiment, the plurality of word lines WL1 to WLn may be sequentially discharged one by one. That is, the word line WL1 may be discharged to 0V, and then the word line WL2 may be discharged to 0V. Thereafter, the word line WL3 may be discharged to 0V, and then the word line WL4 may be discharged to 0V.

As described above, in an embodiment, when the verify voltage apply operation for the setting program state, which is greatly affected by a disturb effect in the program loop of the selected page, is performed, the plurality of word lines WL1 to WLn may be sequentially discharged for each word line group or for each word line during the word line discharge operation.

After the discharge operation of the word line, the voltage of 0V may be applied to the selected source select lines Sel. SSL at T20.

As a result of the determination of the above-described step S1240, when it is determined that the verify voltage corresponding to the setting program state is not applied (No), the plurality of word lines WL1 to WLn of the selected memory block MB1 are simultaneously discharged in step S1260.

For example, a voltage higher than the verify voltage may be applied to the selected word line Sel. WL in T15 to T16, and a potential level of the unselected word lines Unsel. WL may be decreased to be controlled as the low pass voltage Vpass_low. Accordingly, the potential level of the selected word line Sel. WL and the potential level of the unselected word lines Unsel. WL may be controlled to be similar. The voltage of 0V may be applied to the selected drain select lines Sel. DSL.

Thereafter, the word lines WL1 to WLn corresponding to the plurality of page groups GR1 to GRk may be simultaneously discharged at T16. Accordingly, in an embodiment, an operation speed of the memory device may be improved.

After the above-described step S1250 or step S1260, it is determined whether all verify operations are passed in step S1270. For example, it is determined whether the verify operation corresponding to all program states P1 to P7 is passed.

When it is determined that all verify operations are passed in the above-described step S1270 (Yes), the program operation is ended, and when it is determined that at least one verify operation is not passed (No), a new verify voltage is set in step S1280, and then the program operation is performed again from the above-described step S1210.

As described above, according to another embodiment of the present disclosure, when the verify operation using the verify voltage corresponding to the setting program state is performed, the word line discharge operation may sequentially discharge the plurality of word lines WL1 to WLn to minimize the disturb phenomenon, and perform the word line discharge operation in a method of simultaneously discharging the plurality of word lines WL1 to WLn until the verify operation using the verify voltage corresponding to the setting program state is performed to improve an operation speed.

That is, in previous program loops of the program loop corresponding to the setting program state, the word line discharge operation may be performed in a method of simultaneously discharging the plurality of word lines WL1 to WLn, and in the program loop corresponding to the setting program state and a next program loop, the word line discharge operation may be performed in a method of sequentially discharging the plurality of word lines WL1 to WLn.

Figure 14:
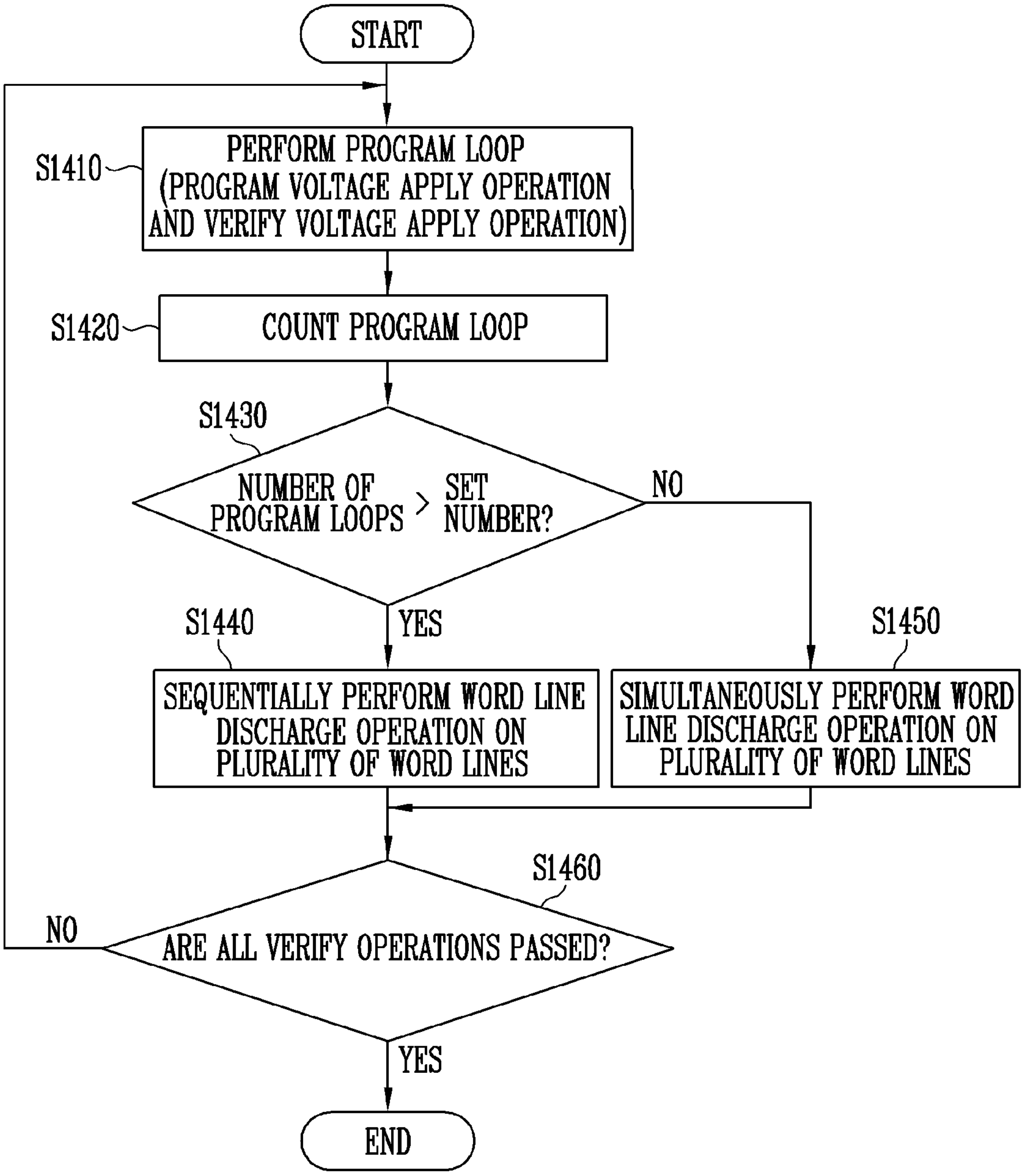
FIG. 14 is a flowchart illustrating a program operation of a memory device according to still another embodiment of the present disclosure.

FIG. 14 is a flowchart illustrating a program operation of a memory device according to still another embodiment of the present disclosure.

The program operation of the memory device according to another embodiment of the present disclosure is described with reference to FIGS. 2 to 5, 8, 11, 13, and 14.

In step S1410, the program loop for the selected page of the selected memory block (for example, MB1), for example, the first program loop LOOP1 is performed.

For example, the program voltage apply operation of applying the program voltage Vpgm and the verify voltage apply operation are sequentially performed.

A program voltage Vpgm is applied to the selected word line Sel. WL corresponding to the selected page.

For example, the page buffers PB1 to PBm receive data to be programmed, and apply a program allowable voltage or a program inhibit voltage to the bit lines BL1 to BLm based on the received program data. For example, the program allowable voltage may be 0V, and the program inhibit voltage may be a positive voltage (for example, VCC).

The voltage generation circuit 210 may generate a pass voltage Vpass in response to the operation signal OP_CMD, and the row decoder 220 may transmit the pass voltage Vpass to the local lines LL connected to the selected memory block (for example, MB1) in response to the row address RADD. Accordingly, the pass voltage Vpass may be applied to the selected word line Sel. WL, unselected word lines Unsel. WL, selected source select lines Sel. SSL, and selected drain select lines Sel. DSL of the selected memory block MB1 (T11 to T12). The pass voltage Vpass or 0V may be selectively applied to unselected source select lines Unsel. SSL and unselected drain select lines Unsel. DSL. In T11 to T21, the source line SL may be controlled as 0V.

Here, the selected word line Sel. WL may be a word line connected to a target page of the program operation, and the unselected word lines Unsel. WL may be word lines except for the selected word lines Sel. WL. The selected source select lines Sel. SSL and the selected drain select lines Sel. DSL may be source select lines and drain select lines connected to memory strings including memory cells to be programmed, and the unselected source select lines Unsel. SSL and the unselected drain select lines Unsel. DSL may be source select lines and drain select lines connected to remaining memory strings.

The voltage generation circuit 210 generates a program voltage Vpgm in response to the operation signal OP_CMD, and the row decoder 220 applies the program voltage Vpgm to the selected word line Sel. WL of the selected memory block MB1 in response to the row address RADD (T12 to T13).

When the program voltage Vpgm is applied to the selected word line Sel. WL during a certain time, the word lines, the source select line, and the drain select lines may be discharged to 0V for a next operation (T13 to T14).

At least one verify voltage is sequentially applied. That is, the verify voltage apply operation is performed, and at least one verify voltage set in the program loop which is currently performed is sequentially applied. For example, the first verify voltage Vf1 may be applied in the first program loop LOOP1 to the third program loop LOOP3, and the first verify voltage Vf1 and the second verify voltage Vf2 may be sequentially applied in the fourth program loop LOOP4 and the fifth program loop LOOP5. In addition, the sixth verify voltage Vf6 and the seventh verify voltage Vf7 may be sequentially applied in the thirteenth program loop LOOP13, and the seventh verify voltage Vf7 may be applied in the fourteenth program loop LOOP14 to the sixteenth program loop LOOP16.

The voltage generation circuit 210 generates at least one verify voltage and the pass voltage Vpass in response to the operation signal OP_CMD, and the row decoder 220 applies the at least one verify voltage to the selected word line Sel. WL of the selected memory block MB1 and applies the pass voltage Vpass to the unselected word lines Unsel. WL, the selected source select lines Sel. SSL, and the selected drain select lines Sel. DSL of the selected memory block MB1, in response to the row address RADD (T14 to T15). The at least one verify voltage may be at least one of the plurality of verify voltages Vf1 to Vf7 corresponding to the plurality of program states P1 to P7.

The page buffers PB1 to PBm sense a potential or a current amount of the bit lines BL1 to BLm to perform the verify operation for the program state corresponding to the verify voltage Vf.

In step S1420, the program loop counter 313 counts the number of program loops performed so far during the program operation.

In step S1430, the discharge controller 310 of the control logic 300 determines whether the number of program loops counted by the program loop counter 313 exceeds the set number.

As a result of the determination of the above-described step S1430, when it is determined that the counted number of program loops exceeds the set number (Yes), the plurality of word lines WL1 to WLn of the selected memory block MB1 are sequentially discharged in step S1440.

For example, a voltage higher than the verify voltage may be applied to the selected word line Sel. WL in T15 to T16, and a potential level of the unselected word lines Unsel. WL may be decreased to be controlled as a low pass voltage Vpass_low. Accordingly, a potential level of the selected word line Sel. WL and the potential level of the unselected word lines Unsel. WL may be controlled to be similar. A voltage of 0V may be applied to the selected drain select lines Sel. DSL.

In T16 to T20, the word lines WL1 to WLn corresponding to the plurality of page groups GR1 to GRk may be sequentially discharged for each word line group. For example, the word line group corresponding to the first page group GR1 may be discharged to 0V, and then the word line group corresponding to the second page group GR2 may be discharged to 0V. Thereafter, the word line group corresponding to the third page group GR3 may be discharged to 0V, and then the word line group corresponding to the fourth page group GR4 may be discharged to 0V.

As another embodiment, each of the plurality of word lines WL1 to WLn may be sequentially discharged. That is, the word line WL1 may be discharged to 0V, and then the word line WL2 may be discharged to 0V. Thereafter, the word line WL3 may be discharged to 0V, and then the word line WL4 may be discharged to 0V. As described above, when the verify voltage apply operation for the setting program state, which is greatly affected by a disturb effect in the program loop of the selected page, is performed, the plurality of word lines WL1 to WLn may be sequentially discharged for each word line group or for each word line.

After the discharge operation of the word line, the voltage of 0V may be applied to the selected source select lines Sel. SSL at T20.

As a result of the determination of the above-described step S1430, when the counted number of program loops is equal to or less than the set number (No), the plurality of word lines WL1 to WLn of the selected memory block MB1 are simultaneously discharged in step S1450.

For example, a voltage higher than the verify voltage may be applied to the selected word line Sel. WL in T15 to T16, and a potential level of the unselected word lines Unsel. WL may be decreased to be controlled as the low pass voltage Vpass_low. Accordingly, the potential level of the selected word line Sel. WL and the potential level of the unselected word lines Unsel. WL may be controlled to be similar. The voltage of 0V may be applied to the selected drain select lines Sel. DSL.

Thereafter, the word lines corresponding to the plurality of page groups GR1 to GRk may be simultaneously discharged at T16. Accordingly, in an embodiment, an operation speed of the memory device may be improved.

In step S1460 after step S1440 or step S1450 described above, it is checked whether the verify operation corresponding to all program states P1 to P7 is determined to be pass. When the verify operation corresponding to all program states is determined to be pass (Yes), the program operation on the selected page may be ended and the program operation for a next page may be started.

When the verify operation corresponding to all program states P1 to P7 is not determined to be pass (No), a next program loop may be selected and the above-described step may be performed again from step S1410.

As described above, according to still another embodiment of the present disclosure, when the repeatedly performed program loop exceeds the setting number, the word line discharge operation may be performed in a method of sequentially discharging the plurality of word lines WL1 to WLn to minimize the effect of the disturb phenomenon, and when the repeatedly performed program loop is equal to or less than the set number, the word line discharge operation may be performed in a method of simultaneously discharging the plurality of word lines WL1 to WLn to improve an operation speed.

Figure 15:
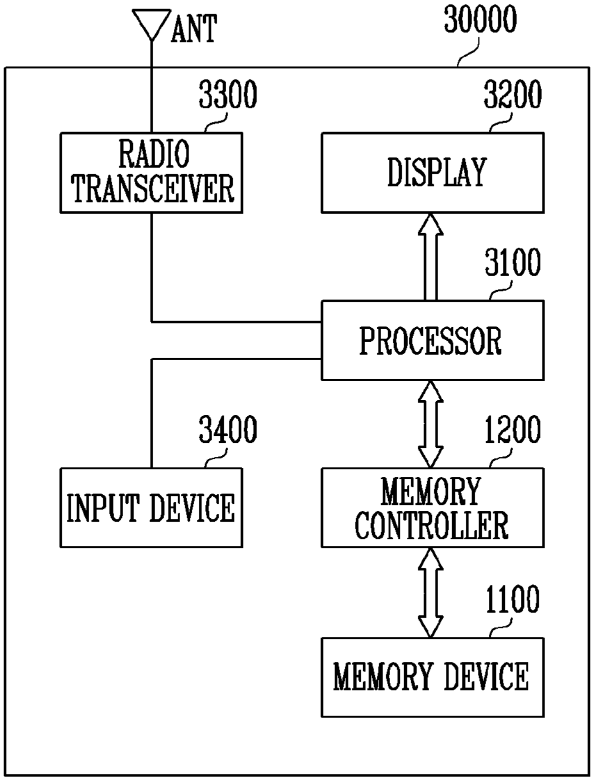
FIG. 15 is a diagram illustrating another embodiment of the memory system including the memory device shown in FIG. 2.

FIG. 15 is a diagram illustrating another embodiment of the memory system including the memory device shown in FIG. 2.

Referring to FIG. 15, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100.

Figure 16:
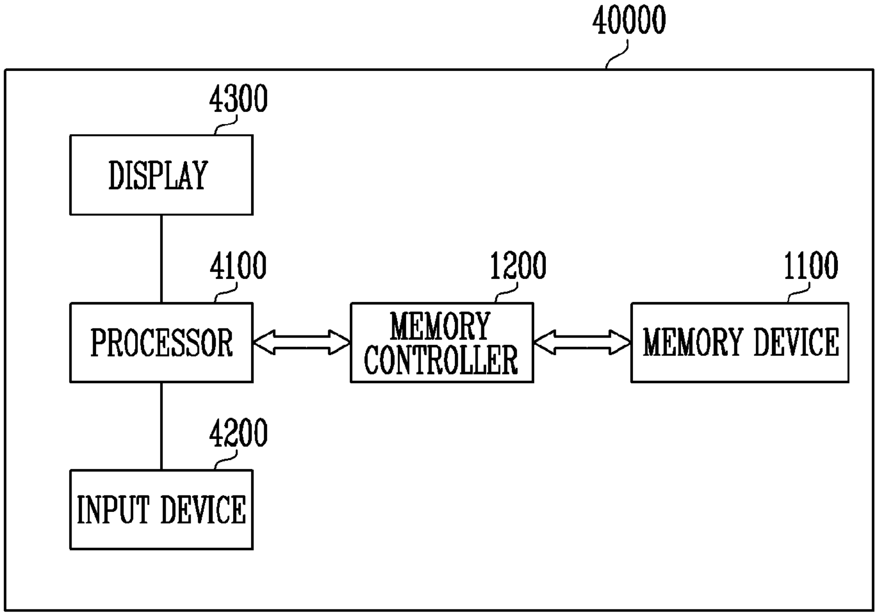
FIG. 16 is a diagram illustrating another embodiment of the memory system including the memory device shown in FIG. 2.

FIG. 16 is a diagram illustrating another embodiment of the memory system including the memory device shown in FIG. 2.

Referring to FIG. 16, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100.

Figure 17:
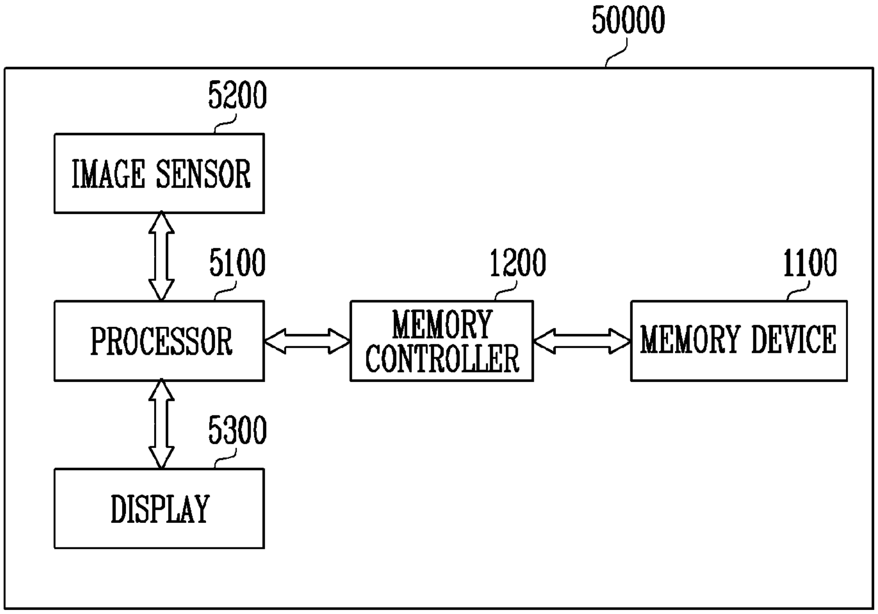
FIG. 17 is a diagram illustrating another embodiment of the memory system including the memory device shown in FIG. 2.

FIG. 17 is a diagram illustrating another embodiment of the memory system including the memory device shown in FIG. 2.

Referring to FIG. 17, the memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100.

Figure 18:
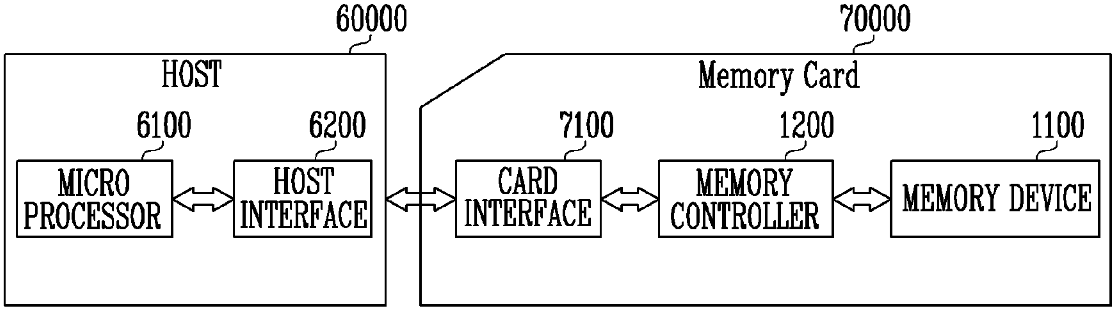
FIG. 18 is a diagram illustrating another embodiment of the memory system including the memory device shown in FIG. 2.

FIG. 18 is a diagram illustrating another embodiment of the memory system including the memory device shown in FIG. 2.

Referring to FIG. 18, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the memory controller 1200 under control of a microprocessor 6100.

Although specific embodiments have been described in the detailed description of the present disclosure, various changes are possible within the limits that do not deviate from the scope and spirit of the present disclosure. Therefore, the scope of the present disclosure should not be limited to the above-described embodiments and should not be defined, but should be defined by those equivalent to the claims of the present disclosure as well as the claims to be described later.

What is claimed is:

1. A memory device comprising:

a memory block including a plurality of pages respectively corresponding to a plurality of word lines;

peripheral circuits configured to apply operation voltages to the plurality of word lines and discharge the plurality of word lines during a program operation; and control logic configured to, during the program operation, determine whether a selected page is included in a weak page group, and to control the peripheral circuits such that the plurality of word lines are sequentially discharged when the selected page is determined to be included in the weak page group, and the plurality of word lines are simultaneously discharged when the selected page is determined to be not included in the weak page group.

2. The memory device of claim 1, wherein the control logic controls the peripheral circuits to perform a program loop for sequentially performing a program voltage apply operation, a verify voltage apply operation, and a word line discharge operation during the program operation at least once or more.

3. The memory device of claim 1, wherein the plurality of pages are divided into a plurality of page groups, and the plurality of word lines are divided into a plurality of word line groups corresponding to the plurality of respective page groups.

4. The memory device of claim 3, wherein the sequential discharge method sequentially discharges each of the plurality of word lines or sequentially discharges the plurality of word line groups.

5. The memory device of claim 1, wherein the discharge controller includes a weak page determiner, and the weak page determiner determines whether the selected page on which the program operation is being performed is included in the weak page group.

6. The memory device of claim 3, wherein the weak page group is any one group among the plurality of page groups, and the weak page group is a page group having a relatively larger program disturb effect than another page group having a relatively smaller program disturb effect.

7. The memory device of claim 3, wherein the weak page group is a page group including memory cells in which a channel width of a memory cell is relatively smaller than another channel width of another memory cell among the plurality of page groups.

8. A method of operating a memory device, the method comprising:

sequentially applying a program voltage and a verify voltage to a selected word line corresponding to a selected page among a plurality of pages respectively corresponding to a plurality of word lines;

determining whether the selected page is included in a weak page group;

sequentially discharging the plurality of word lines when the selected page is included in the weak page group; and simultaneously discharging the plurality of word lines when the selected page is not included in the weak page group.

9. The method of claim 8, wherein the plurality of pages are divided into a plurality of page groups, and the plurality of word lines are divided into a plurality of word line groups corresponding to the plurality of respective page groups.

10. The method of claim 9, wherein sequentially discharging the plurality of word lines comprises sequentially discharging each of the plurality of word lines or sequentially discharging the plurality of word line groups for each group.

11. The method of claim 9, wherein the weak page group is any one group among the plurality of page groups, and the weak page group is a page group having a relatively larger program disturb effect than another page group having a relatively smaller program disturb effect.

12. The method of claim 9, wherein the weak page group is a page group including memory cells in which a channel width of a memory cell is relatively smaller than another channel width of another memory cell among the plurality of page groups.

* * * * *